(12) United States Patent
Kranitzky

(10) Patent No.: US 6,825,647 B2
(45) Date of Patent: Nov. 30, 2004

(54) METHOD FOR TESTING A FREQUENCY CONVERTER

(75) Inventor: Walter Kranitzky, Traunstein (DE)

(73) Assignee: Dr. Johannas Heidenhain GmbH, Traunreut (DE)

( * ) Notice: Subject to any disclaimer, the term of this patent is extended or adjusted under 35 U.S.C. 154(b) by 0 days.

(21) Appl. No.: 10/417,400

(22) Filed: Apr. 16, 2003

(65) Prior Publication Data
US 2004/0008021 A1 Jan. 15, 2004

(30) Foreign Application Priority Data
Apr. 16, 2002 (DE) .......................................... 102 16 986

(51) Int. Cl.$^7$ .............................................. G01R 25/00
(52) U.S. Cl. ........................................ 324/85; 363/157
(58) Field of Search ........................ 318/41, 434, 768; 324/72.6, 85, 515, 530, 686; 363/41, 71, 132, 157

(56) References Cited

U.S. PATENT DOCUMENTS

| | | | |
|---|---|---|---|
| 4,228,513 A | * 10/1980 | Doljack | 198/810.02 |
| 5,196,775 A | * 3/1993 | Harris et al. | 318/638 |
| 5,510,725 A | 4/1996 | Schantz, Jr. et al. | 324/768 |
| 6,160,414 A | 12/2000 | Matsubara et al. | 324/765 |
| 6,593,751 B2 | * 7/2003 | Takahashi | 324/551 |

FOREIGN PATENT DOCUMENTS

| | | |
|---|---|---|
| DE | 39 37 447 A1 | 5/1991 |
| EP | 0 848 492 A1 | 6/1998 |
| JP | 59-178979 A | 10/1984 |
| JP | 62-290362 | 12/1987 |
| WO | WO 91/07797 A1 | 5/1991 |

OTHER PUBLICATIONS

Patent Abstracts of Japan document regarding Japanese publication 59–178979 A, published by Japanese Patent Office, 1984, one page.
Patent Abstracts of Japan document regarding Japanese publication 62–290362 A, published by Japanese Patent Office, 1987, one page.

* cited by examiner

Primary Examiner—Anjan Deb
Assistant Examiner—Walter Benson
(74) Attorney, Agent, or Firm—Brinks Hofer Gilson & Lione

(57) ABSTRACT

A method for testing a frequency converter having individual switching elements and motor connectors for each phase of the frequency converter. The method includes selectively activating the individual switching elements of the frequency converter and applying a control pattern to a control input of each phase of the frequency converter. Registering voltage patterns occurring at the motor connectors for each phase of the frequency converter, wherein the registering is performed for each of the motor connectors via a single test line that is capacitively connected to the motor connectors. Comparing the control pattern applied to the control input with the voltage patterns registered for each phase of the frequency converter. Detecting a malfunction in the frequency converter in case of a deviation of the voltage patterns, registered at the motor connectors, from voltage patterns expected as a result of the control pattern applied to the control input.

6 Claims, 3 Drawing Sheets

METHOD FOR TESTING A FREQUENCY CONVERTER

Applicant claims, under 35 U.S.C. §119, the benefit of priority of the filing date of Apr. 16, 2002 of a German patent application, copy attached, Serial No. 102 16 986.1, filed on the aforementioned date, the entire contents of which are incorporated herein by reference.

BACKGROUND OF THE INVENTION

1. Field of the Invention

The present invention relates to a method for testing a frequency converter, wherein individual switching elements of the frequency converter are selectively activated.

2. Description of the Related Art

In cases where a malfunction has occurred, methods of this type are used for the localization of a source of the malfunction.

Electrical drive mechanisms are employed in modem machine tools for the purpose of moving various machine elements in a controlled manner. Thus, drive mechanisms for shafts provide for the movement of the individual shafts of the machine tools into the required positions, spindle drives provide for the rotary movement of a tool, such as a milling head or a drill. For this purpose, a numerical control device converts the movements, which have been preset in programs, such as CNC programs, into positional set points, which are supplied to a regulating unit including position, rpm and current regulators. Voltage set points are generated in the current regulator, which are converted by a frequency converter by the so-called pulse width modulation. For this purpose, the phases of the motor are connected in the frequency converter with the positive and negative supply voltage via two switching elements. The switches are turned on as a function of the pattern of the pulse width modulation in order to generate the required voltage potential at each phase of a motor which is required for achieving the current set points.

There are numerous sources for malfunctions, which can lead to incorrect functioning, in a system which is constructed in such a complex manner. Methods are therefore known for detecting such malfunctions.

Thus, EP 0 848 492 A1 describes a method for detecting incorrect functioning of a drive system of the type described above. Individual phases of a motor are selectively charged with a set point current for this purpose. If the predetermined set point current has not been reached, it is assumed that there is a malfunction in the system. In this method it is disadvantageous that following the detection of a malfunction it is not clear where the malfunction is located. It is not possible to differentiate between a malfunction in the voltage converter and, for example, a short circuit or a line disruption outside of the voltage converter. Accordingly, there is a requirement for special methods, by which the ability of individual components, in particular the voltage converter, can be tested.

SUMMARY AND OBJECTS OF THE INVENTION

It is therefore an object of the present invention to disclose a method, by which the operativeness of a voltage converter can be tested.

This object is attained by a method for testing a frequency converter having individual switching elements and motor connectors for each phase of the frequency converter. The method includes selectively activating the individual switching elements of the frequency converter and applying a control pattern to a control input of each phase of the frequency converter. Registering voltage patterns occurring at the motor connectors for each phase of the frequency converter, wherein the registering is performed for each of the motor connectors via a single test line that is capacitively connected to the motor connectors. Comparing the control pattern applied to the control input with the voltage patterns registered for each phase of the frequency converter. Detecting a malfunction in the frequency converter in case of a deviation of the voltage patterns, registered at the motor connectors, from voltage patterns expected as a result of the control pattern applied to the control input.

A method for testing a voltage converter is now proposed, by which the operativeness of a voltage converter can be tested.

In a first step, individual switching elements of the voltage converter are selectively activated by applying a control pattern to the control input of each phase of the voltage converter. In the next step, the voltage pattern occurring at the motor connectors of the voltage converter is registered for each phase. Moreover, the applied control pattern is compared with the registered voltage pattern for each phase. In case of a deviation of a voltage pattern, detected at the motor connector, from the voltage pattern expected on the basis of the control pattern applied at the control input, a malfunction in the voltage converter is recognized.

Since very high voltages are present at the motor connector of each phase, these connectors must be galvanically separated from the device with which testing is performed. This is advantageously achieved in a very simple way in that the test lines are capacitively connected with the motor connectors. For this it might be sufficient to merely place the test lines near the motor connectors. It is furthermore possible by the described method to register all phases of the voltage converter by means of only one test line, which is capacitively connected to all motor connectors.

Further advantages, as well as details, of the present invention ensue from the following description of a preferred method by the drawings.

DESCRIPTION OF THE PREFERRED EMBODIMENT(S) OF THE INVENTION

Figure 1:
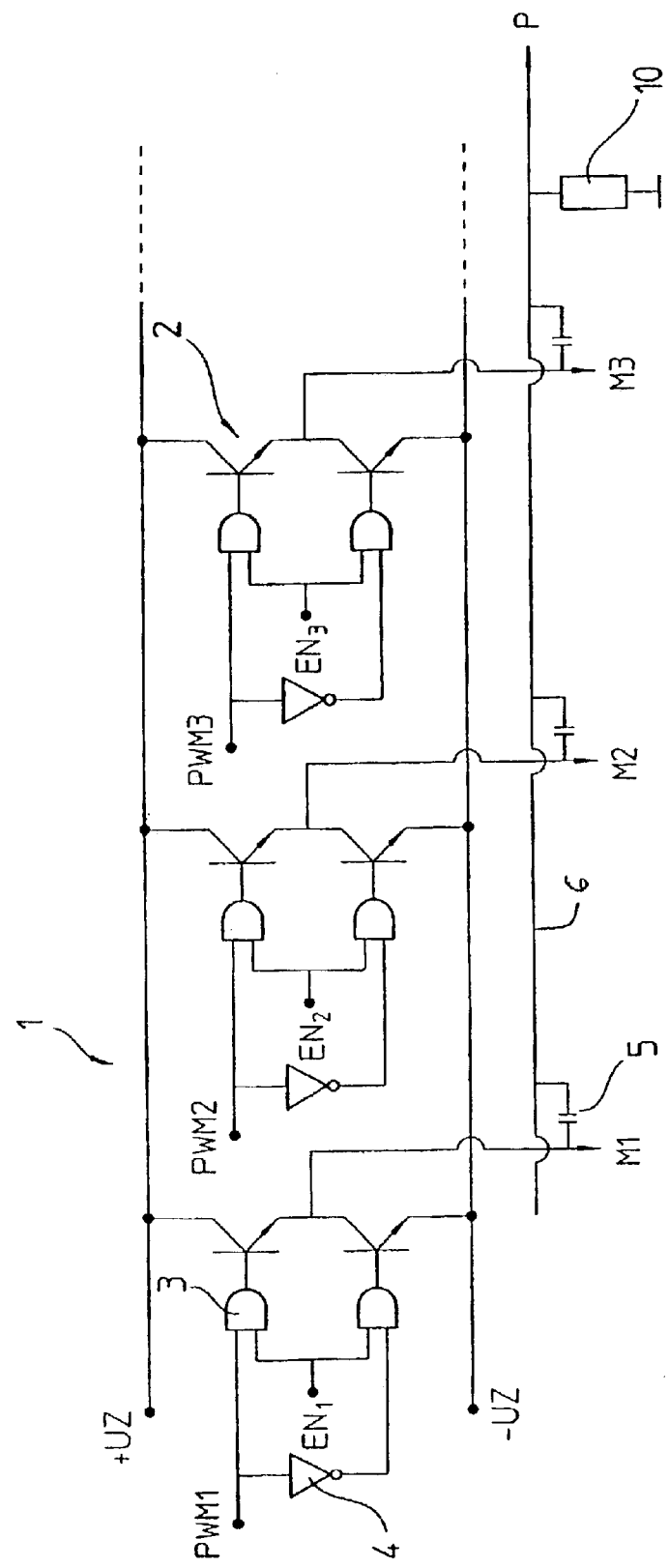
FIG. 1 shows a circuit diagram of an embodiment of a frequency converter to be tested in accordance with the present invention.

A frequency converter 1 is schematically represented in FIG. 1. Such a frequency converter 1 generates a pulsed a.c. voltage from a d.c. voltage at the motor connectors M1, M2, M3. For this purpose switching elements 2 (for example IGBTs) are suitably controlled, which connect each motor connector M1, M2, M3 either with the positive potential +Uz, or with a negative potential −Uz of the d.c. voltage.

One motor connector M1, M2, M3, and therefore two switching elements 2 are required per motor phase. Respectively two switching elements 2 of a motor connector M1, M2, M3 form a phase of the frequency converter. The control patterns, which are applied to the control inputs PWM1, PWM2, PWM3 of the phases of the frequency converter 1, respectively, activate one of the two switching elements 2 of a phase of the frequency converter 1, provided this phase was selected via an activating input EN1, EN2, EN3. This logic device is schematically represented in FIG. 1 by the inverter 4 and the logical AND linkages 3. If a phase was not selected, both switching elements 2 of this phase block, thus the potential of the corresponding motor connector M1, M2, M3 is undefined. In that case no current can flow via this phase. Suitable control patterns provide for the application of the voltage values preset by the current regulator to the motor, not represented, by a pulse width modulation.

Figure 2:
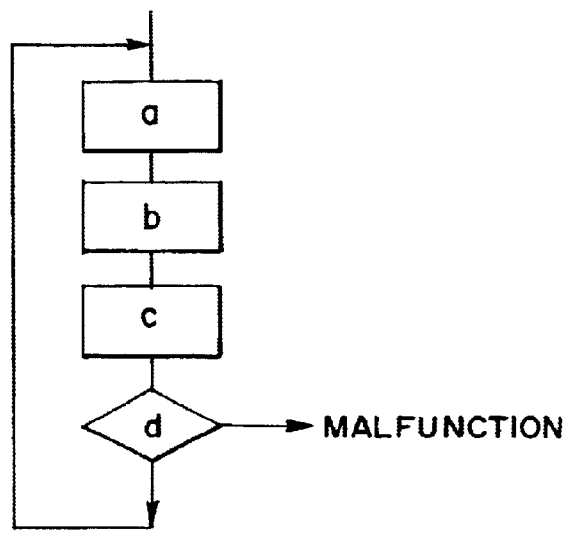
FIG. 2 shows a flow chart of a first embodiment of a method for testing the frequency converter of FIG. 1 in accordance with the present invention.

The method for testing a phase of the voltage converter 1 will now be explained by FIG. 2. The method is repeated in the way indicated in FIG. 2 for each one of the phases of the frequency converter.

Figure 3:
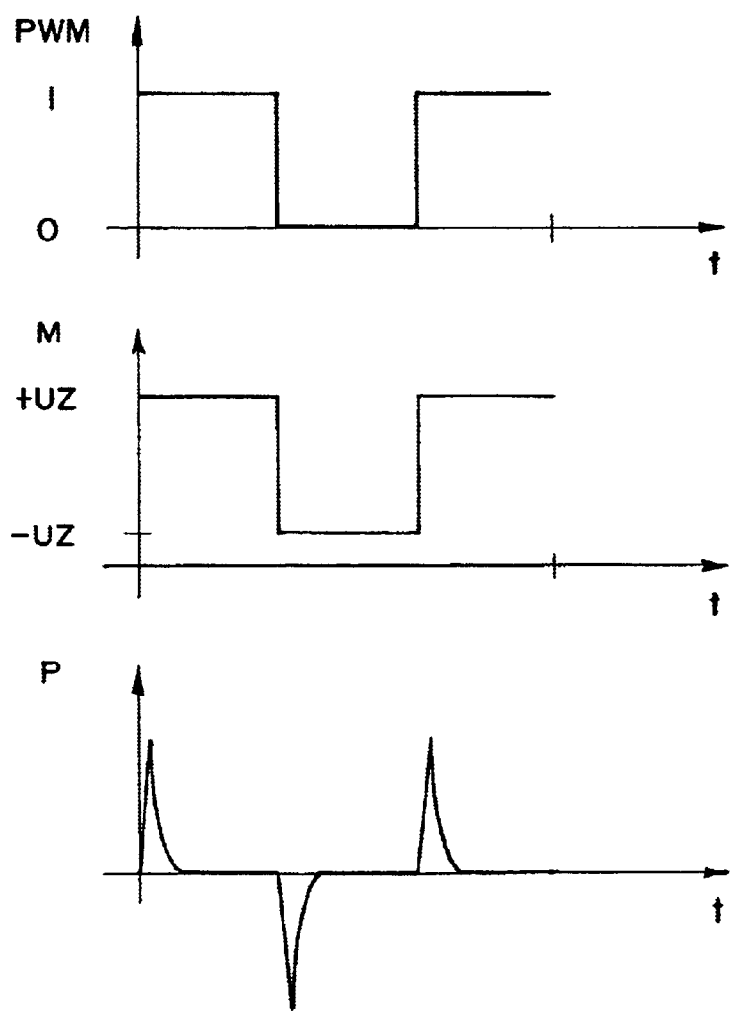
FIG. 3 show various signal diagrams of signals to be used with the frequency converter of FIG. 1 and the method of FIG. 2.

In a step (a), a suitable control pattern is applied to the control input PWM1, PWM2, PWM3 of a phase, and this phase is selected simultaneously with this via the activating input EN1, EN2, EN3. The rest of the phases remain deactivated. A possible control pattern PWM is represented in FIG. 3, and can also be described by 0-1-0. A voltage pattern M in accordance with FIG. 3 will result at the motor connector M1, M2, M3, if the logic device composed of the inverter 4 and the AND linkages 3 and the switching elements 2 functions correctly.

This voltage pattern M is recorded in a step (b). Since a galvanic separation of the motor connectors M1, M2, M3 is required because of the occurring high voltages, a test line 6 is capacitively connected with the motor connector M1, M2, M3. This is indicated in FIG. 1 by means of the capacitors 5. Since a capacitance of a few pF is sufficient for a capacitor 5, a particularly simple solution was found. It is sufficient to place the test line 6 in the vicinity of the motor connector M1, M2, M3, for example by placing a few windings of the test line 6 around the motor connector M1, M2, M3. A single test line 6 can be used particularly advantageously, which is capacitively connected to all motor connectors M1, M2, M3, since always only one phase of the frequency converter 2 is activated in accordance with the described method.

A test signal P in accordance with FIG. 3 results on the test line 6 because of the capacitive connection of the test line 6 because, together with the capacitor 5 and a resistor 10 connected between the test line 6 and ground, the test line 6 acts like an RC member, to whose input the voltage pattern M of the motor connector M1, M2, M3 is applied.

Figure 4:
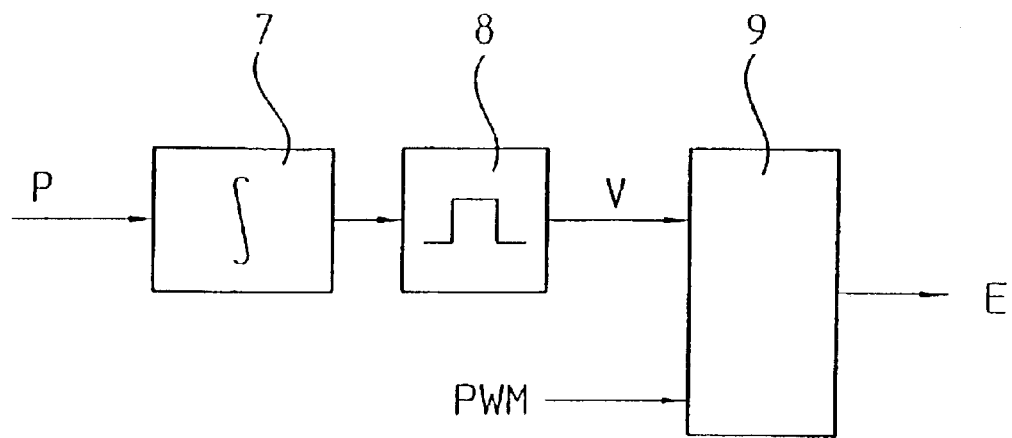
FIG. 4 schematically shows a first embodiment of a circuit for evaluating a test signal applied to the frequency converter of FIG. 1 in accordance with the present invention.

Now, in a step (c) the test signal P is compared with the originally applied control pattern PWM. This can be done particularly simply if the test signal P is compared with the control pattern PWM by a circuit arrangement in accordance with FIG. 4. The test signal P can be converted into a binary comparison signal V corresponding to the control pattern PWM by an integrator 7 and a comparator 8 that receives the integrated signal from integrator 7 and compares the integrated signal is a reference value that can be generated by either an internal reference voltage or an external reference voltage. It is therefore only necessary to check the sameness of the control pattern PWM and the comparison signal V in the pattern comparison logic device 9 and to output an appropriate result E.

If the signals are equal, it is determined in step (d) that the just tested phase of the voltage converter 1 operates correctly, and the testing of the next phase can be started. If the signals differ from each other (wherein short propagation delays must be tolerated because of the RC member alone), a malfunctioning phase is recognized. An appropriate malfunction report can be generated. The method can be stopped at this point, or the remaining phases of the voltage converter 1 can be tested for further malfunctions.

It should be mentioned that, when testing a phase of the voltage converter 1, the remaining phases should be deactivated. Only then is it assured that a defect in a connected motor example, does not result in a malfunction detection in the described method. But this means that the described method can be advantageously performed with a motor connected, but that in spite of this only the testing of the frequency converter 1 is performed.

The method is suitable for frequency converters 1 with any arbitrary number of phases. A single test line 6 is sufficient in the described exemplary embodiment. The circuit for converting and comparing the control pattern PWM and the test signal P described in FIG. 4 can be realized simply as a discrete circuit, or it can also be realized in the form of software in the numerical control which controls the drive mechanism with the voltage converter 1. This numerical control can be advantageously employed for controlling the entire method, provided it is appropriately designed.

The present invention may be embodied in other forms than those specifically disclosed herein without departing from its spirit or essential characteristics. The described embodiments are to be considered in all respects only as illustrative and not restrictive, and the scope of the invention is commensurate with the appended claims rather than the foregoing description.

I claim:

1. A method for testing a frequency converter comprising individual switching elements and motor connectors for each phase of said frequency converter, said method comprising:

selectively activating said individual switching elements of said frequency converter;

applying a control pattern to a control input of each phase of said frequency converter;

registering voltage patterns occurring at said motor connectors for each phase of said frequency converter, wherein said registering is performed for each of said motor connectors via a single test line that is capacitively connected to said motor connectors;

comparing said control pattern applied to said control input with said voltage patterns registered for each phase of said frequency converter; and detecting a malfunction in said frequency converter in case of a deviation of said voltage patterns, registered at said motor connectors, from voltage patterns expected as a result of said control pattern applied to said control input.

2. The method in accordance with claim 1, comprising converting a test signal in said single test line into a comparison pattern corresponding to said control pattern.

3. The method in accordance with claim 2, comprising converting said test signal into said comparison pattern by an integrator and a comparator.

4. The method in accordance with claim 2, wherein said comparing said control pattern comprises comparing said comparison pattern with said control pattern.

5. The method in accordance with claim 3, wherein said comparing said control pattern comprises comparing said comparison pattern with said control pattern.

6. A testing system comprising:

a frequency converter comprising:

motor connectors;

switching elements connected to said motor connectors, wherein said switching elements connect each of said motor connectors with either a positive potential or a negative potential and said switching elements receive a control pattern that activates said switching elements;

a single test line capacitively connected to said motor connectors, wherein a test signal is a voltage pattern of said motor connections for each phase of said frequency converter, and is carried by said single test line; and a comparator that receives a comparison signal based on said test signal from said single test line and compares said comparison signal with said control pattern.

\* \* \* \* \*